United States Patent
Vu et al.

(10) Patent No.: US 6,894,399 B2
(45) Date of Patent: May 17, 2005

(54) MICROELECTRONIC DEVICE HAVING SIGNAL DISTRIBUTION FUNCTIONALITY ON AN INTERFACIAL LAYER THEREOF

(75) Inventors: Quat T. Vu, Santa Clara, CA (US); Tuy T. Ton, San Jose, CA (US); Steven Towle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 09/845,881

(22) Filed: Apr. 30, 2001

(65) Prior Publication Data

US 2002/0158334 A1 Oct. 31, 2002

(51) Int. Cl.[7] .................. H01L 23/48; H01L 23/52; H01L 29/40
(52) U.S. Cl. .................. 257/786; 361/777; 361/778
(58) Field of Search .................. 257/529, 530, 257/664, 665, 786, 723, 738, 737, 778, 777, 774, 685, 725, 758, 781; 361/767, 777, 778

(56) References Cited

U.S. PATENT DOCUMENTS

| | | | |
|---|---|---|---|
| 5,055,532 A | 10/1991 | Hoffman et al. | ............ 525/528 |
| 5,105,257 A | 4/1992 | Michii | ............ 357/70 |
| 5,327,012 A | * | 7/1994 | Yano et al. ............ 257/758 |

(Continued)

FOREIGN PATENT DOCUMENTS

| | | | |
|---|---|---|---|
| EP | 0149317 | 7/1985 | ............ H05K/3/28 |
| EP | 0361825 | 4/1990 | ......... H01L/23/522 |
| EP | 0431205 | 6/1991 | ......... H01L/23/498 |
| EP | 0476971 | 3/1992 | ............ H01L/23/15 |
| EP | 0611129 | 8/1994 | ............ H01L/21/58 |
| EP | 0777274 | 6/1997 | ......... H01L/23/538 |
| EP | 0877419 | 11/1998 | ............ H01L/21/60 |
| EP | 1111662 | 6/2001 | ............ H01L/21/00 |
| GB | 2174543 | 11/1986 | ............ H01L/23/50 |
| JP | 62-004351 | 1/1987 | ............ H01L/23/48 |
| JP | 10-125721 | 5/1998 | ............ H01L/21/60 |
| JP | 11045955 | 2/1999 | ............ H01L/23/12 |
| JP | 11-204688 | 7/1999 | ............ H01L/23/12 |
| JP | 11312868 | 11/1999 | ............ H05K/3/46 |
| JP | 2000-243870 | 9/2000 | ............ H01L/23/12 |
| JP | 2000-307005 | 11/2000 | ............ H01L/21/82 |
| JP | 2000-349203 | 12/2000 | ............ H01L/23/28 |

OTHER PUBLICATIONS

Chen, Chang–Lee, et al., "Bond Wireless Multichip Packaging Technology for High–Speed Circuits", *IEEE Transactions on Components, Hybrids, and Manufacturing Technology*, 15, NY, US, (1992), 451–456.

Daum, W., et al., "Overlay High–Density Interconnect: A Chips–First Multichip Module Technology", *IEEE Computer Society*, 26, Long Beach, CA, US, (1993), 23–29.

Gdula, Michael, et al., "An Overlay Interconnect Technology for 1GHz. and Above MCMs", *Proceedings of the Multi Chip Module Conference (MCMC)*, Santa Cruz, US, (1992), 171–174.

*Primary Examiner*—Asok Kumar Sarkar
(74) *Attorney, Agent, or Firm*—Schwegman, Lundberg, Woessner & Kluth, P.A.

(57) ABSTRACT

A microelectronic device includes a microelectronic die having an interfacial metal layer deposited over an active surface thereof to perform a signal distribution function within the device. The microelectronic die is fixed within a package core to form a die/core assembly. One or more metallization layers may then be built up over the die/core assembly as part of a packaging scheme. The interfacial metal layer can be applied either before or after the die is fixed within the package core. In one approach, the interfacial layer is applied during wafer-level processing.

26 Claims, 5 Drawing Sheets

U.S. PATENT DOCUMENTS

| | | | |
|---|---|---|---|
| 5,346,858 A | 9/1994 | Thomas et al. | 437/189 |
| 5,353,498 A | 10/1994 | Fillion et al. | 29/840 |
| 5,355,283 A | 10/1994 | Marrs et al. | 361/760 |
| 5,422,513 A | 6/1995 | Marcinkiewicz et al. | 257/668 |
| 5,497,033 A | 3/1996 | Fillion et al. | 257/723 |
| 5,503,286 A | 4/1996 | Nye, III et al. | 216/13 |
| 5,523,622 A | 6/1996 | Harada et al. | 257/734 |
| 5,527,741 A | 6/1996 | Cole et al. | 437/209 |
| 5,608,262 A | 3/1997 | Degani et al. | 257/723 |
| 5,701,032 A | 12/1997 | Fischer et al. | 257/692 |
| 5,703,400 A | 12/1997 | Wojnarowski et al. | 257/723 |
| 5,707,894 A | 1/1998 | Hsiao | 437/209 |
| 5,745,984 A | 5/1998 | Cole, Jr. et al. | 29/834 |
| 5,798,567 A | 8/1998 | Kelly et al. | 257/723 |
| 5,844,317 A * | 12/1998 | Bertolet et al. | 257/773 |
| 5,864,470 A | 1/1999 | Shim et al. | 361/777 |
| 6,014,317 A | 1/2000 | Sylvester | 361/760 |
| 6,049,465 A | 4/2000 | Blish, II et al. | 361/767 |
| 6,060,777 A | 5/2000 | Jamieson et al. | 257/707 |
| 6,084,297 A | 7/2000 | Brooks et al. | 257/698 |
| 6,084,777 A | 7/2000 | Kalidas et al. | 361/707 |
| 6,130,478 A | 10/2000 | Dumoulin et al. | 257/728 |
| 6,153,448 A * | 11/2000 | Takahashi et al. | 438/114 |
| 6,154,366 A | 11/2000 | Ma et al. | 361/704 |
| 6,162,652 A | 12/2000 | Dass et al. | 438/18 |
| 6,222,246 B1 | 4/2001 | Mak et al. | 257/532 |
| 6,239,482 B1 | 5/2001 | Fillion et al. | 257/678 |
| 6,242,282 B1 | 6/2001 | Fillion et al. | 438/106 |
| 6,249,044 B1 * | 6/2001 | Kao et al. | 257/678 |
| 6,255,737 B1 * | 7/2001 | Hashimoto | 257/784 |
| 6,271,469 B1 | 8/2001 | Ma et al. | 174/52.4 |
| 6,284,566 B1 | 9/2001 | Lee et al. | 438/107 |
| 6,287,893 B1 | 9/2001 | Elenius et al. | 438/108 |
| 6,291,775 B1 * | 9/2001 | Saitoh | 174/250 |
| 6,333,565 B1 * | 12/2001 | Hashimoto | 257/781 |
| 6,388,333 B1 | 5/2002 | Taniguchi et al. | 257/777 |
| 6,388,337 B1 * | 5/2002 | Michael et al. | 257/781 |
| 6,396,148 B1 * | 5/2002 | Eichelberger et al. | 257/758 |
| 6,590,291 B2 | 7/2003 | Akagawa | 257/774 |
| 6,621,155 B1 * | 9/2003 | Perino et al. | 257/686 |
| 2001/0013654 A1 | 8/2001 | Kalidas et al. | 257/738 |
| 2002/0008314 A1 | 1/2002 | Takeuchi | 257/697 |
| 2002/0070443 A1 | 6/2002 | Mu et al. | 257/712 |
| 2002/0158334 A1 | 10/2002 | Vu et al. | 257/723 |

* cited by examiner

MICROELECTRONIC DEVICE HAVING SIGNAL DISTRIBUTION FUNCTIONALITY ON AN INTERFACIAL LAYER THEREOF

FIELD OF THE INVENTION

The invention relates generally to microelectronic circuits and, more particularly, to structures and techniques for packaging such circuits.

BACKGROUND OF THE INVENTION

After a microelectronic circuit chip (i.e., a die) has been manufactured, the chip is typically packaged before it sold to the public. The package provides both protection for the chip and a convenient and often standardized method for mounting the chip within an external system. The circuit package must include some means for providing electrical communication between the various terminals of the circuit chip and the exterior environment. Many different packaging technologies have been used in the past for providing this communication. The type of package that is used for a particular chip can have a significant impact on the performance of the completed device. Typically, in a high volume manufacturing environment, cost will be a primary concern in selecting a packaging technology. Performance is also a very important criterion. As circuits get smaller and faster, there is an ongoing need for innovative and cost effective packaging technologies.

DETAILED DESCRIPTION

Figure 1:
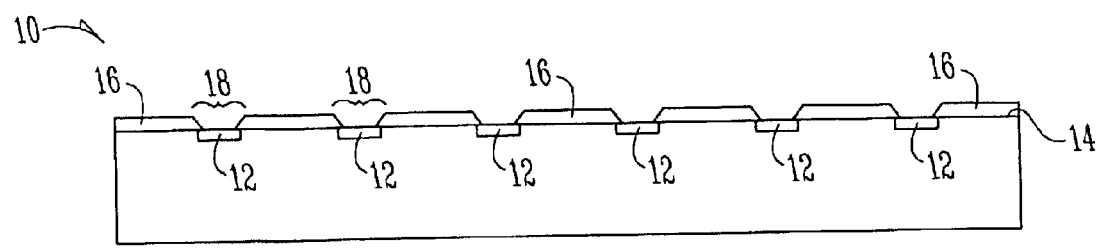
FIG. 1 is a sectional side view of a microelectronic die having a passivation layer on an upper surface thereof.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to techniques and structures for packaging microelectronic circuits using a build up process on the surface of a microelectronic die. That is, one or more metallization layers are built up over the active surface of the die as part of the packaging process to provide for electrical interconnection between the terminals of the die and the exterior environment (e.g., an exterior circuit board). An interfacial layer is first formed on the active surface of the die to, among other things, enhance the alignment budget of the upper metallization layer(s). One or more build up metallization layers are then formed over the interfacial layer to provide conductive connections between the bond pads of the die and the external package contacts. One of the functions of the interfacial layer, therefore, is to provide conductive through connections between the bond pads of the die and corresponding structures on the first build up metallization layer. In accordance with the present invention, the interfacial layer is also used to provide signal distribution or transmission functions for the die. In this manner, the interfacial layer can be used to replace or supplement signal distribution or transmission structures normally present within the die itself. Because larger metallization dimensions are typically achievable within the interfacial layer than within the die, lower resistance lines are possible on the interfacial layer. Consequently, these lines will produce less resistive drop, less skew, and less RC effect than lines within the die. The principles of the present invention can therefore be used to increase the signal routing performance of a microelectronic device. The inventive principles can also be used to reduce the complexity of the signal distribution scheme within a die. The inventive principles can be implemented in connection with a wide range of microelectronic circuit types and are particularly beneficial when used in connection with relatively complex circuits such as, for example, digital processing devices.

FIG. 1 is a simplified cross-sectional side view of a microelectronic die 10. Although not shown, the die 10 includes multiple individual layers each having circuitry disposed thereon. The die 10 also includes a plurality of conductive bond pads 12 on an active surface 14 thereof for providing an electrical interface to the circuitry of the die 10. For ease of illustration, only six bond pads 12 are shown in FIG. 1. It should be appreciated, however, that a much larger number of bond pads are typically present on a microelectronic die. A passivation layer 16 covers the active surface of the die 10 to protect the die 10 from the surrounding environment. Typically, the passivation layer 16 will consist of a dielectric material such as polyimide or silicon nitride.

Openings 18 in the passivation layer 16 allow electrical connections to be made to the bond pads 12 of the die 10. Before the die 10 is inserted into an external circuit, it will normally be packaged. The circuit package provides additional protection for the die 12 and also provides a convenient structure for mounting the chip within an external circuit. The package includes external contacts or leads that are to be conductively coupled to corresponding structures on an external circuit board when the microelectronic device is mounted into a system. The external contacts or leads extend into the package where they are conductively coupled to corresponding bond pads 12 on the active surface 14 of the die 10. As discussed previously, in accordance with the present invention, the conductive coupling between the external package leads and the bond pads 12 of the die 10 is provided, at least in part, by one or more patterned and interconnected metallization layers built up on the die 10.

Figure 2:
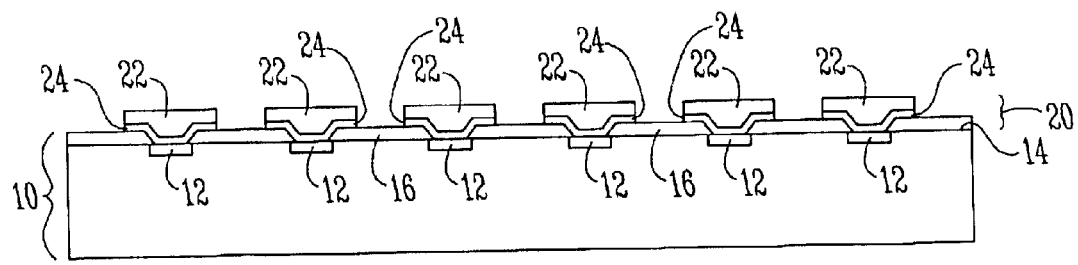
FIG. 2 is a sectional side view of the microelectronic die of FIG. 1 after an interfacial layer having a plurality of expanded pads has been deposited upon the passivation layer.

FIG. 2 is a sectional side view of the microelectronic die 10 of FIG. 1 after an interfacial layer 20 has been deposited upon the passivation layer 16. As illustrated, the interfacial layer 20 includes a plurality of expanded pads 22 that is conductively coupled to corresponding bond pads 12 on the active surface 14 of the die 10 through the openings 18 in the passivation layer 16. The expanded pads 22 are wider than the corresponding bond pads 12 of the die 10 and thus serve to increase the alignment budget for the vias that will subsequently be created to provide electrical communication between the interfacial layer 20 and the next metallization layer to be applied (i.e., the first build up layer). When the vias are created by laser drilling, the expanded pads 22 (which are preferably copper) also allow the laser to encounter the material of the pad (e.g., copper) at the completion of the via rather than a less desirable material. With reference to FIG. 2, a conductive underlayer 24 is preferably deposited within and around the openings 18 of the passivation layer 16 before the expanded pads 22 are fully formed. The underlayer 24 is used primarily to increase the adhesion of the interfacial layer 20 to the passivation material 16. In addition, if the expanded pads 22 and the bond pads 12 consist of dissimilar metals that can produce undesirable junction effects (e.g., copper and aluminum), a conductive underlayer material can be selected that will prevent the occurrence of any undesirable junction effects between the dissimilar metals. Further, the conductive underlayer 24 can serve as a seed layer in a semiadditive patterning process. Typical underlayer materials include, for example, chromium, titanium, tantalum, nickel, copper, and combinations thereof.

Figure 3:
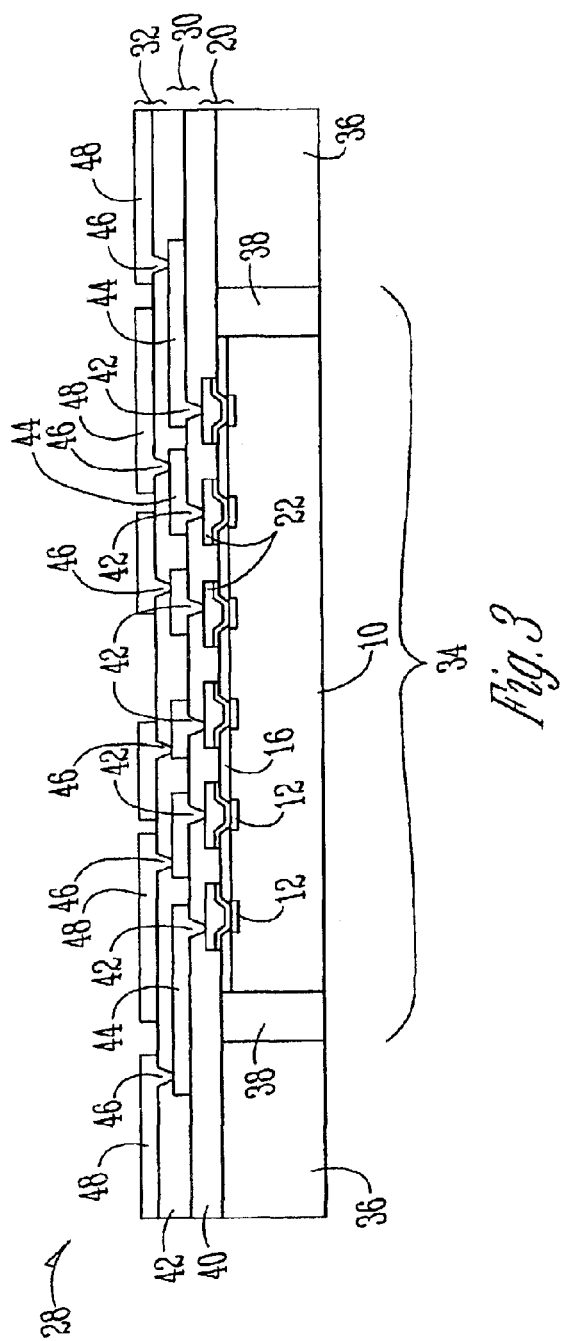
FIG. 3 is a sectional side view of a microelectronic die assembly having an interfacial layer and two build up layers disposed upon the upper surface of a microelectronic die.

In a preferred approach, the die 10 of FIG. 2 is fixed within a package core before the build up metallization layers are deposited. As will be described in greater detail, the package core serves to increase the area available for pitch expansion and escape routing for the die 10. FIG. 3 is a sectional side view of a die assembly 28 that uses this approach. As illustrated, the die 10 is mounted within an opening 34 in a package core 36. The die 10 is held in place within the core 36 by an encapsulation material 38 (e.g., plastics, resins, epoxies, elastomers, and the like) that is injected into the gap between the die 10 and the core 36. The package core 36 can be fabricated from any of a wide variety of different materials. For example, the package core 36 can be formed from bismaleimide triazine (BT), various resin-based materials (e.g., epoxy), flame retarding glass/epoxy materials (e.g., FR4), polyimide-based materials, ceramic materials, and various metal materials (e.g., copper). In at least one embodiment, a commercially available dielectric board material is used to form the package core. In the illustrated structure, the upper surface of the passivation layer 16 of the die 10 and the upper surface of the encapsulation material 38 are made flush with the upper surface of the package core 36. In an alternative structure, the upper surface of the passivation layer 16 of the die 10 is higher than the upper surface of the package core 36 and the encapsulation material 38 is allowed to fill a small region above the core 36 where it is made flush with the passivation layer 16 of the die 10. Other arrangements for fixing the die 10 within the package core 36 are also possible. The interfacial layer 20 can be formed on the die 10 either before or after the die 10 is mounted within the package core 36. In one approach, the interfacial layer 20 is applied at the wafer level using a modified form of controlled collapse chip connect (C4) processing (e.g., alternative bump metallurgy).

As illustrated in FIG. 3, two build up metallization layers 30, 32 are formed above the interfacial layer 20. As described above, these build up layers 30, 32 are used to provide conductive coupling between the bond pads 12 of the die 10 and the external contacts or leads of the package. Although two build up layers 30, 32 are shown in FIG. 3, it should be appreciated that any number of build up layers can be used in accordance with the present invention. The number of layers used in a particular implementation will typically depend upon the level of pitch expansion and/or signal escape routing that is desired. After the die 10 has been mounted within the core 36 and the interfacial layer 20 has been formed, a first dielectric layer 40 is deposited over the expanded pads 22. The first dielectric layer 40 can be formed from any of a variety of different dielectric materials including, for example, glass particle filled epoxy resins (e.g., Ajinomoto Buildup Film (ABF) available from Ajinomoto), bisbenzocyclobutene (BCB) (available from Dow), polyimide, silicone rubber materials (e.g., DC6812 from DowCorning), various low-k dielectrics (e.g., SiLK from Dow Chemical), and others. Via holes 42 are next formed through the first dielectric layer 40 in alignment with the expanded pads 22. As shown, because the expanded pads 22 have been made relatively wide, a significant amount of via alignment error can be tolerated. Any available method can be used to form the via holes 42 through the first dielectric layer 40 including, for example, laser techniques, photolithograpy techniques using wet or dry etching, use of photoimageable dielectric materials, and others.

After the via holes 42 have been formed, the metallization pattern of the first build up layer 30 is deposited. As illustrated, the conductive elements 44 of the first build up layer 30 extend outward toward the edges of the structure to afford the subsequent build up layer additional area for forming conductive linkages to the first build up layer. Some of the conductive elements 44 within the first buildup layer 30 extend outward over the encapsulation material 38 and the package core 36. Thus, the core 36 allows reduced metallization pitch to be achieved on successive build up layers. The second build up layer 32 is formed in a similar manner to the first build up layer 30. Via holes 46 are formed through a second dielectric layer 42 and a metallization pattern 48 is then deposited on the second dielectric layer 42.

Figure 4:
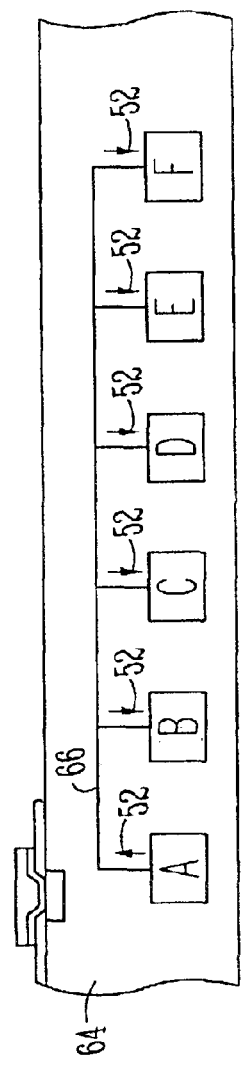
FIG. 4 is a sectional side view of a microelectronic die having internal signal distribution functionality to distribute a signal between internal circuits.
Figure 5:
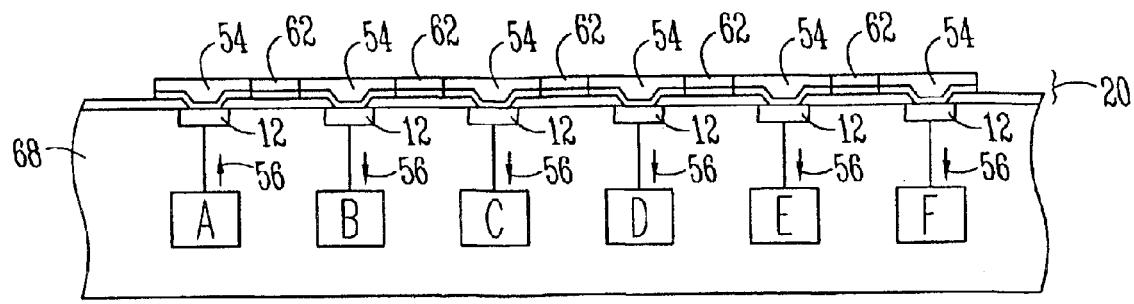
FIG. 5 is a sectional side view of a microelectronic die having signal distribution functionality on an interfacial layer to distribute a signal between internal circuits in accordance with one embodiment of the present invention.

In one aspect of the present invention, the fine pitch patterning capabilities offered by semiadditive buildup and other package metallization patterning technologies are taken advantage of to provide additional wiring functionality within the interfacial layer of a microelectronic device. For example, in at least one embodiment, the interfacial layer is used to provide signal distribution functionality (e.g., clock distribution) within a device. FIG. 4 is a simplified sectional side view of a microelectronic die assembly that uses a conventional signal distribution approach. As shown, the die assembly of FIG. 4 includes a die 64 having an internal signal distribution medium 66 (e.g., an H-tree or grid) for distributing a signal 52 (e.g., a clock signal) generated within a first circuit (i.e., circuit A) to multiple other circuits (i.e., circuits B, C, D, E, and F) within the die 64. This signal distribution medium 66 is implemented on one or more of the internal layers of the die 64 and thus has dimensions (and, therefore, performance characteristics) that are dictated by the design rules of the die 64. FIG. 5 illustrates a die assembly having a die 68 that includes signal distribution functionality implemented on the interfacial layer 20 above the die 68 in accordance with one embodiment of the present invention. As shown, the die 68 includes a number of internal circuits (i.e., circuits A, B, C, D, E, and F) that are each conductively coupled to a corresponding bond pad 12 of the die 68. Each of the bond pads 12 is connected to a corresponding expanded pad 54 within the interfacial layer 20 as described above. The expanded pads 54 of the interfacial layer 20 are interconnected by trace portions 62 between the pads 54. Thus, a signal 56 generated by one of the circuits (e.g., circuit A) will be distributed to each of the other circuits (e.g., circuits B, C, D, E, and F) through the structures on the interfacial layer 20. A similar distribution approach could be implemented on one of the build up layers.

Because the pitch requirement is usually less strict on the interfacial layer 20 than within the die 68 itself, the metal thickness of the signal distribution structure can typically be significantly larger (e.g., 5–15 micrometers rather than 0.5–2 micrometers). As described above, larger line dimensions translate into lower resistance/higher performance lines. Thus, less voltage drop will be experienced and more predictable phase delays will result. The approach illustrated in FIG. 5 can also be used to distribute a signal received from an external source (e.g., a data signal received at one of the package leads or from another electrical component disposed within the same package) to multiple locations within the die 68.

In the die assembly illustrated in FIG. 5, the trace portions 62 occur between adjacent pads 54 within the interfacial layer 20. It should be appreciated that the trace portions 62 of the interfacial layer 20 can be used to couple any combination of pads on the interfacial layer 20, regardless of location, in accordance with the present invention. The only limitations on the trace portions 62 are the available space between pads 54 on the interfacial layer 20 and the capabilities and tolerances of the particular metal deposition process being implemented as well as the restriction that two different lines cannot cross on a single layer.

Figure 6:
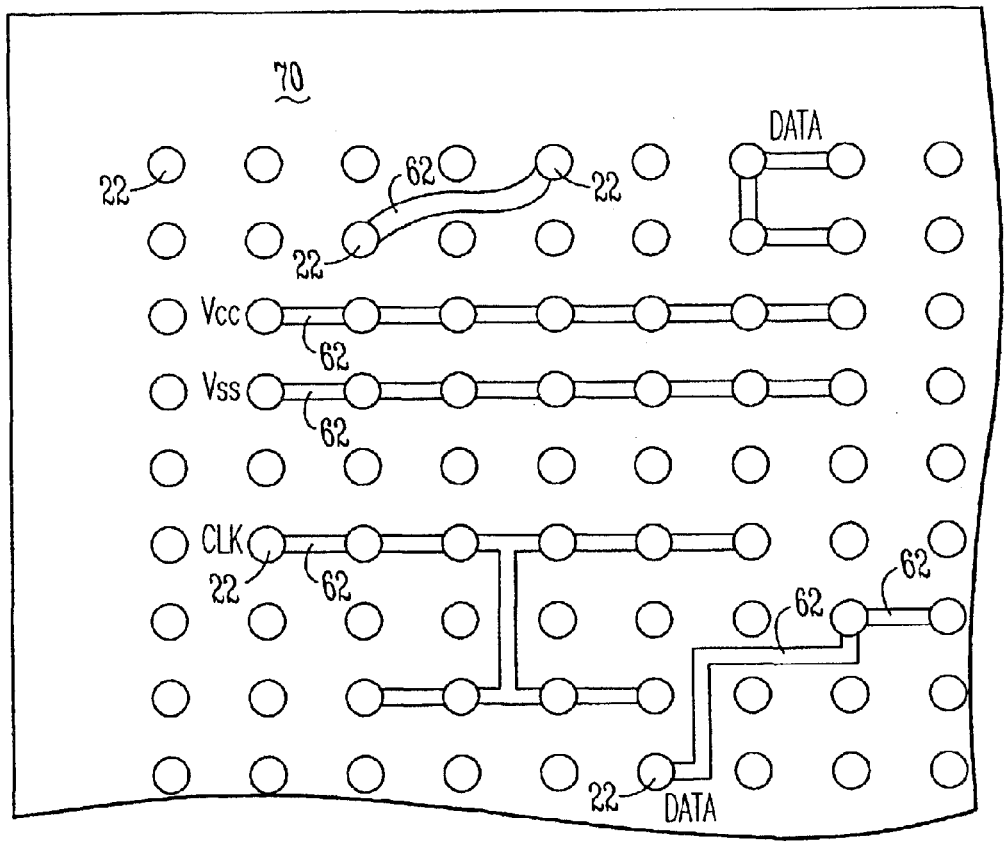
FIG. 6 is a top view illustrating a portion of an interfacial layer metal pattern in accordance with one embodiment of the present invention.

FIG. 6 is a top view illustrating a portion of an interfacial layer metal pattern in accordance with one embodiment of the present invention. As illustrated, a number of expanded pads 22 are arranged on the upper surface 70 of a die. Selected pads 22 on the upper surface 70 are interconnected using conductive trace portions 62. As described previously, the trace portions 62 on the interfacial layer can be used to provide signal distribution (e.g., data and clock signals) for the underlying die. The trace portions 62 can also be used to provide power distribution for the die. The trace portions 62 can take a wide variety of shapes and can interconnect adjacent pads 22 or pads 22 that are relatively far from one another. In the illustrated embodiment, one group of interconnected pads is used to carry a first supply potential (e.g., $V_{CC}$) within the device and a second group is used to carry a second supply potential (e.g., $V_{SS}$) within the device. Another group of interconnected pads 22 is used to distribute a clock signal (CLK) within the device. Trace portions 62 are also provided for making data connections (DATA) within the device. In one approach, the entire metallization pattern on the interfacial layer (including both the pads 22 and the trace portions 62) is formed during a single deposition process (e.g., using a single mask). In FIG. 6, the pads 22 are arranged in straight rows and columns. It should be appreciated, however, that there are typically few restrictions on the layout of pads on the interfacial layer. For example, if two traces need to pass between two adjacent pads 22 on the interfacial layer, the pads 22 can be moved further apart to accommodate the lines.

With reference to FIG. 6, the pads 22 that are used solely for internal connections within the die (e.g., the CLK pads) will not be connected upward into the package (i.e., to the first build up layer 30 and above). Such pads can be made relatively small because the alignment capability between the interfacial layer pad 22 and the bond pad opening is typically much better than the alignment between the interfacial layer pad 22 and the build up layers of the package. This is especially true if the interfacial layer 20 is applied on-wafer. By making some of the interfacial layer pads 22 smaller, additional wire routing is possible in the vicinity of those pads.

Figure 7:
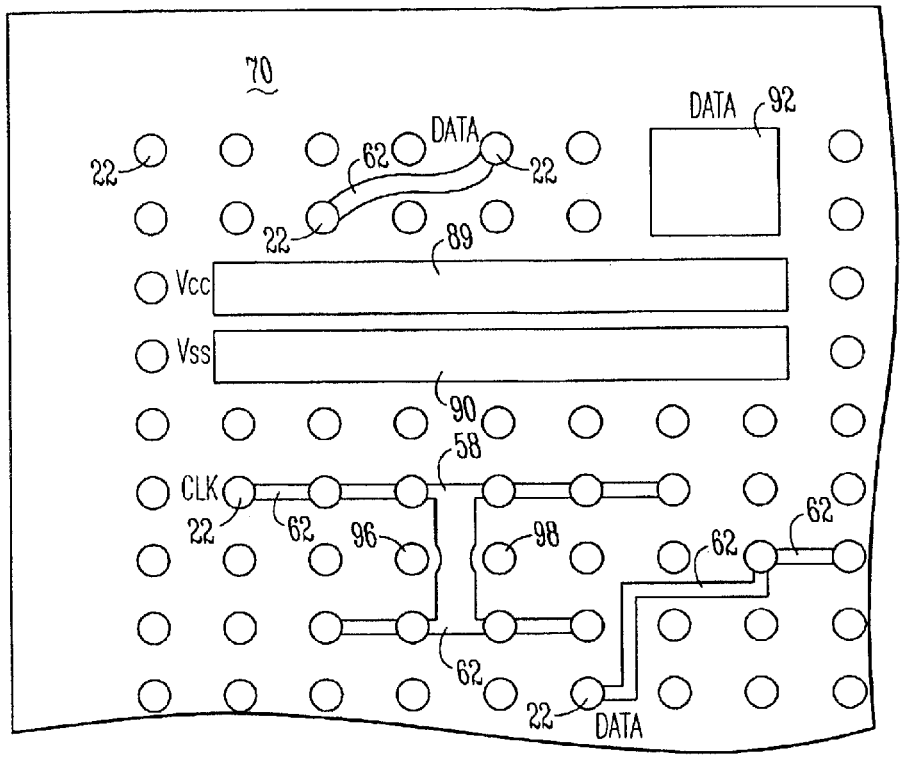
FIG. 7 is a top view illustrating a portion of an interfacial layer metal pattern in accordance with another embodiment of the present invention.

FIG. 7 illustrates a modified version of the metallization pattern of FIG. 6. As illustrated, instead of clearly discernable pads and trace portions, the pattern of FIG. 7 uses a single rectangular conductive element 89 to encompass the $V_{CC}$ bond pads and another rectangular element 90 to encompass the $V_{SS}$ bond pads. The metallization pattern of FIG. 7 also includes a single square conductive element 92 to interconnect four data pads of the underlying die. Many alternative shapes can also be used. In addition, an interconnect 58 within the interfacial layer of FIG. 7 has a narrowed region where the interconnect 58 passes between two pads 96, 98. As will be appreciated, a wide variety of different interfacial layer metal configurations can be implemented in accordance with the present invention. The primary goal is to provide communication between multiple pad locations on the interfacial layer to effect signal and/or power distribution or transmission for the underlying die.

In a conventional chip manufacturing process, after the silicon processing has been completed, the resulting dice are tested and sorted. If signal distribution functionality is being implemented on the interfacial layer, however, the dice may not be fully functioning after the silicon processing has ended. That is, the interfacial layer 20 needs to be deposited before full functionality will be achieved. Therefore, in accordance with one aspect of the present invention, the test and sort operation is performed after the interfacial layer has been applied or the added functionality is incorporated as part of the testing apparatus.

Figure 8:
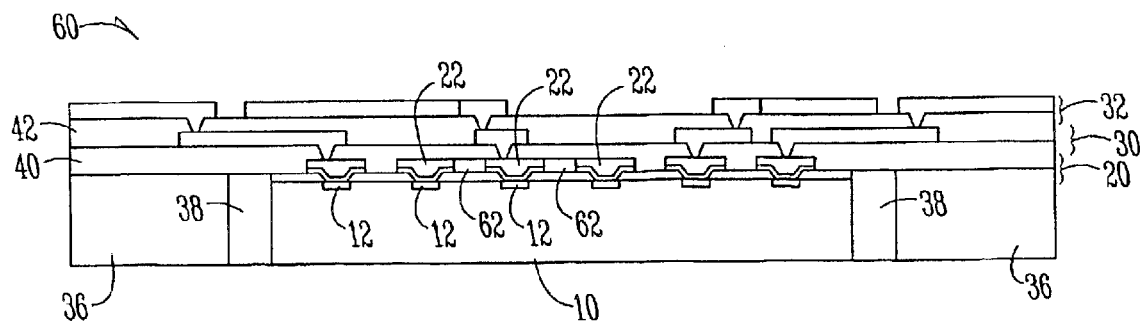
FIG. 8 is a sectional side view of a microelectronic die assembly having signal distribution functionality on an interfacial layer thereof in accordance with one embodiment of the present invention.

As described previously, the principles of the present invention can be used to distribute a signal received from an exterior source to multiple locations within a die. FIG. 8 is a sectional side view of a die assembly 60 in accordance with one embodiment of the present invention that enables such signal distribution. As in previous embodiments, the die assembly 60 includes trace portions 62 on the interfacial layer 20 that conductively couple three expanded pads 22 on the layer. The three expanded pads 22 that are coupled together are also conductively coupled to an external contact or lead of the circuit package (not shown), or to a separate electronic component within the same package, through the two build up layers 30, 32 of the package. A signal to be distributed is routed to the three interconnected expanded pads 22 which distribute the signal to the three corresponding bond pads 12 of the die 10.

Figure 9:
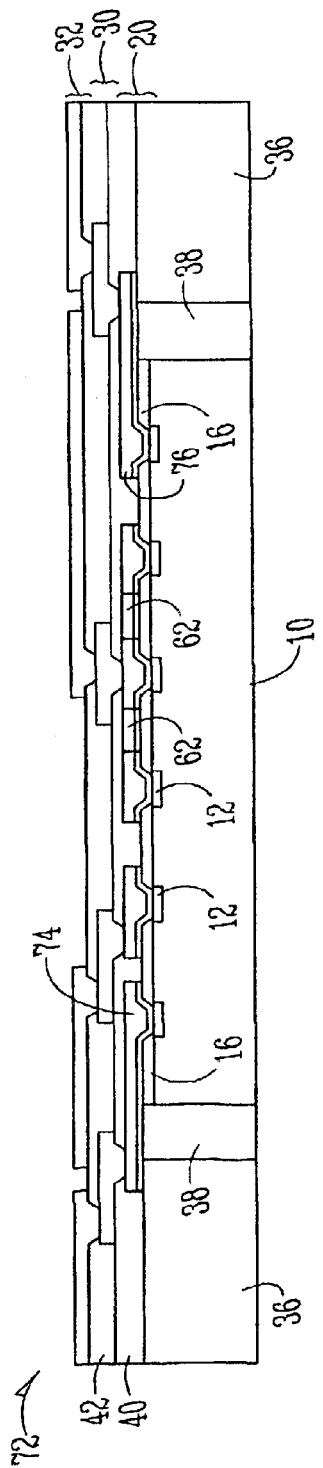
FIG. 9 is a sectional side view of a microelectronic die assembly having signal distribution functionality on an interfacial layer thereof in accordance with another embodiment of the present invention.

In accordance with the present invention, a die will typically be mounted within a package core as part of the packaging process. The interfacial layer can be deposited on the die either before or after the die is mounted within the package core. It is generally less expensive to apply the interfacial layer before mounting (e.g., on the wafer). This approach also offers greater process flexibility (e.g., possibility of processing at higher temperatures). However, application of the interfacial layer to the die before the die is mounted within the package core limits the extent of the interfacial layer metal to the dimensions of the upper surface of the die. If the interfacial layer metallization is applied after mounting, the metallization pattern can extend beyond the dimensions of the die to cover the encapsulation material and the package core. FIG. 9 is a sectional side view of a die assembly 72 in accordance with one embodiment of the present invention that illustrates this technique. As shown, the outermost conductive elements 74, 76 of the interfacial layer 20 of the die assembly 72 extend outward over the encapsulation material 38 and the package core 36. The conductive elements on the first build up layer 30 can thus be spaced much less densely than before. Although typically this will only affect the die-package interconnections at or near the edge of the die, this approach offers considerable benefit because it can be used to expand the pitch of signal pads on the die, which are often located near the edge. As the routing of traces from these signal pads is typically the most crowded portion of the package, expanding the pitch on the interfacial layer can enable a reduction in the number of escape layers from two or more to just one, thereby reducing cost. Alternatively, expanding pitch on the interfacial layer can be used to allow upper build up layers to be produced at coarser pitch, also reducing cost.

To fabricate the assembly of FIG. 9, the die 10 is first fixed within the package core 36 in a manner that causes the upper surface of the die 10 to be flush with the upper surface of the core 36. Additional processing may then be performed to further planarize the upper surface of the die/core assembly. The interfacial layer metallization pattern is then formed on the die/core assembly in a known manner, such as by semiadditive electroplating. Because part of the metallization pattern is formed over the encapsulation material 38 and the package core 36, non-conductive materials must be used to form the upper surfaces of these structures when using this approach. In an alternative approach, an additional dielectric layer is formed and patterned above the core 36 before the interfacial layer metallization pattern is applied. Thus, a conductive material can now be used for the package core 36 because it is conductively isolated from the interfacial layer by the added dielectric layer. It should be appreciated that many alternative core arrangements can be implemented. In one embodiment, for example, a package core is provided that has a floor portion that contacts the lower surface of the die to act as a heat sink to remove heat from the die 10. Other configurations are also possible.

Figure 10:
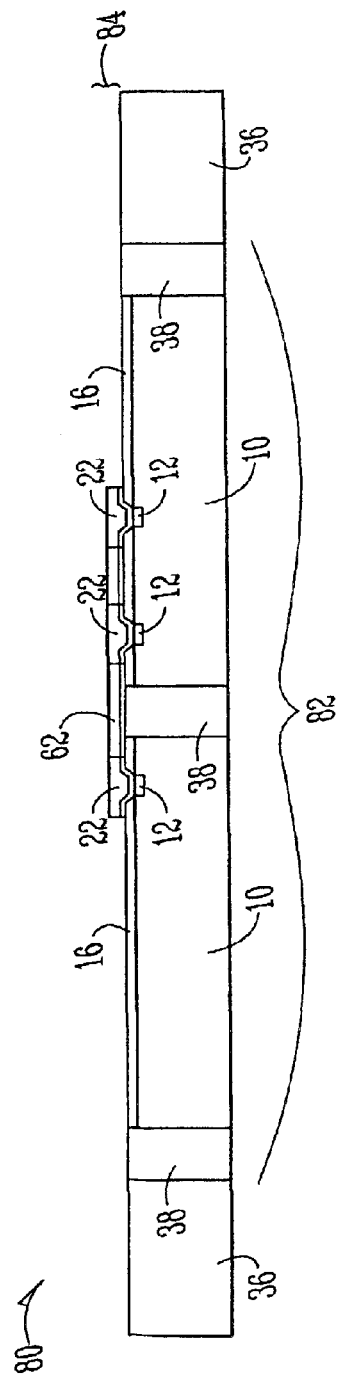
FIG. 10 is a sectional side view of a microelectronic die assembly having multiple interconnected dice in accordance with one embodiment of the present invention.

FIG. 10 is a sectional side view of a portion of a multiple-chip die assembly 80 in accordance with one embodiment of the present invention. For ease of illustration and to facilitate understanding, the build up layers and portions of the interfacial layer are not shown in FIG. 10. As illustrated, two microelectronic dice 10 are fixed within a single opening 82 in a package core 36 using an encapsulation material 38. After a sufficiently planarized upper surface has been achieved, an interfacial layer 84 is formed, as described previously. As shown, the interfacial layer 84 includes expanded pads 22 that are each conductively coupled to a corresponding bond pad 12 on an associated die 10. In addition, the interfacial layer 84 includes at least one trace portion 62 to conductively couple expanded pads 22 associated with different dies to provide inter-chip signal transmission/distribution functionality. Using this approach, a single signal can be distributed between multiple chips in a system in a relatively efficient manner (e.g., a clock signal distributed to multiple chips). This technique also allows multiple stages in a processing chain to be connected together within a single circuit package. For example, processed data output from circuitry within a first die can be fed directly into another die for further processing. In a similar manner, a clock signal generated by circuitry within a first die can be coupled to circuitry within a second die through the interfacial layer 84. As will be apparent to persons of ordinary skill in the art, many alternative inter-chip connection schemes can be used in accordance with the present invention. The inter-chip connections can be made on the interfacial layer 84 and/or on one or more of the build up layers. Embodiments using more than two dies can also be implemented. As with the single die embodiments, the sort operation of the multiple chip ensemble could be performed after formation of the interface layer. The dies can be fixed within a single opening (as in FIG. 10) or in multiple separate openings in the package core 36.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A microelectronic device comprising:
   a microelectronic die having a plurality of bond pads on an active surface thereof, said microelectronic die being fixed within an opening in a package core; and
   an interfacial metal layer deposited over said active surface of said microelectronic die, said interfacial metal layer having a plurality of conductive elements including at least one single conductive element that is conductively coupled to multiple bond pads on said active surface of said microelectronic die to provide signal distribution between points within said microelectronic die.

2. The microelectronic device of claim 1, comprising:
   at least one build up metallization layer deposited over said interfacial metal layer, said at least one build up metallization layer being conductively coupled to said interfacial metal layer through a dielectric layer having a plurality of via holes.

3. The microelectronic device of claim 1, wherein:
   said at least one single conductive element includes a first pad that is directly coupled to a first bond pad on said active surface of said microelectronic die, a second pad that is directly coupled to a second bond pad on said active surface of said microelectronic die, and a conductive trace portion connecting said first and second pads.

4. The microelectronic device of claim 1, wherein:
   said at least one single conductive element is configured to receive a signal from a first bond pad on said active surface of said microelectronic die to transfer said signal to a second bond pad on said active surface of said microelectronic die.

5. The microelectronic device of claim 4, wherein:
   said microelectronic die includes a clock source to provide a clock signal to a first bond pad on said active surface, wherein said interfacial metal layer includes a conductive element that is conductively coupled to said first bond pad and to a plurality of other bond pads on said active surface to distribute said clock signal to said plurality of other bond pads.

6. The microelectronic device of claim 1, wherein:
said package core is formed from a metal material.

7. The microelectronic device of claim 1, wherein:
said interfacial metal layer is deposited on a passivation layer of said microelectronic die.

8. The microelectronic device of claim 1, wherein:
said microelectronic die is fixed within said opening in said package core using an encapsulation material.

9. A microelectronic device comprising:
a microelectronic die having a plurality of bond pads on an active surface thereof, said microelectronic die being fixed within an opening in a package core;
an interfacial metal layer deposited over said active surface of said microelectronic die, said interfacial metal layer having at least one single conductive element that is conductively coupled to multiple bond pads on said active surface of said microelectronic die to provide signal distribution between points within said microelectronic die; and
a second microelectronic die fixed within said package core, wherein said interfacial metal layer includes at least one conductive element that is conductively coupled to both a first bond pad on said active surface of said first microelectronic die and a second bond pad on an active surface of said second microelectronic die.

10. A microelectronic device comprising:
at least one microelectronic die having a plurality of bond pads on an active surface thereof and a passivation layer covering said active surface, said passivation layer having a plurality of openings in locations corresponding to said plurality of bond pads, said at least one microelectronic die being fixed within a package core; and
an interfacial metal layer over said passivation layer, said interfacial metal layer having a plurality of separate conductive elements including at least one separate conductive element that is conductively coupled to multiple bond pads on said at least one microelectronic die through corresponding openings in said passivation layer.

11. The microelectronic device of claim 10, wherein:
said at least one separate conductive element on said interfacial layer is configured to receive a signal from a first of said multiple bond pads to distribute said signal to each other of said multiple bond pads.

12. The microelectronic device of claim 10, wherein:
said at least one separate conductive element on said interfacial layer is conductively coupled to a first external contact of said microelectronic device through said metallization layer.

13. The microelectronic device of claim 12, wherein:
said at least one separate conductive element on said interfacial layer is configured to receive a signal from said first external to distribute said signal to said multiple bond pads in response thereto.

14. The microelectronic device of claim 10, wherein:
said at least one microelectronic die includes a first microelectronic die and a second microelectronic die, wherein said at least one separate conductive element on said interfacial layer is conductively coupled to both a first bond pad on said first microelectronic die and a second bond pad on said second microelectronic die.

15. The microelectronic device of claim 14, wherein:
said at least one separate conductive element on said interfacial layer is configured to receive a signal from said first bond pad on said first microelectronic die to deliver said signal to said second bond pad on said second microelectronic die.

16. The microelectronic device of claim 10, wherein:
said interfacial metal layer includes a first portion overlapping said at least one microelectronic die and a second portion overlapping said package core.

17. The microelectronic device of claim 10, comprising:
a dielectric layer deposited on said interfacial metal layer, said dielectric layer having a plurality of via holes in locations corresponding to selected conductive elements on said interfacial metal layer.

18. The microelectronic device of claim 17, comprising:
a metallization layer deposited on said dielectric layer, said metallization layer having conductive elements that are conductively coupled to said selected conductive elements of said interfacial metal layer through said plurality of via holes in said dielectric layer.

19. The microelectronic device of claim 18, wherein:
said metallization layer includes a first portion overlapping said at least one microelectronic die and a second portion overlapping said package core.

20. A microelectronic device comprising:
a package core;
a first microelectronic die fixed within said package core, said first microelectronic die having bond pads on an active surface thereof;
a second microelectronic die fixed within said package core, said second microelectronic die having bond pads on an active surface thereof; and
an interfacial metal layer deposited over said first and second microelectronic dice, said interfacial metal layer having a first single conductive element that is conductively coupled to multiple bond pads on said first microelectronic die and to both a first bond pad on said first microelectronic die and a second bond pad on said second microelectronic die.

21. The microelectronic device of claim 20, wherein:
said first single conductive element is conductively coupled to multiple bond pads on said second microelectronic device.

22. The microelectronic device of claim 20, wherein:
said first single conductive element has a first portion on a passivation layer of said first microelectronic die and a second portion on a passivation layer of said second microelectronic die.

23. The microelectronic device of claim 20, wherein:
said first and second microelectronic dice are fixed within a common opening in said package core.

24. The microelectronic device of claim 20, wherein:
said first and second microelectronic dice are each fixed within a separate opening in said package core.

25. The microelectronic device of claim 20, wherein:
said first and second microelectronic dice are fixed within said package core using an encapsulation material.

26. The microelectronic device of claim 20, wherein:
said first microelectronic die includes a signal source to provide a signal to said first bond pad, wherein said first single conductive element of said interfacial metal layer is configured to transfer said signal from said first bond pad to said second bond pad.

* * * * *